US012813162B2

(12) United States Patent
Ye et al.

(10) Patent No.: US 12,813,162 B2
(45) Date of Patent: Nov. 24, 2026

(54) MAGNETIC TUNNEL JUNCTION-BASED MAGNETIC RANDOM ACCESS MEMORY DEVICE AND MANUFACTURING METHOD THEREFOR

(71) Applicants: BEIJING INSTITUTE OF TECHNOLOGY, Beijing (CN); YANGTZE DELTA GRADUATE SCHOOL OF BIT (JIAXING), Jiaxing (CN)

(72) Inventors: Shujun Ye, Beijing (CN); Yeliang Wang, Beijing (CN)

(73) Assignees: BEIJING INSTITUTE OF TECHNOLOGY, Beijing (CN); YANGTZE DELTA GRADUATE SCHOOL OF BIT (JIAXING), Jiaxing (CN)

( * ) Notice: Subject to any disclaimer, the term of this patent is extended or adjusted under 35 U.S.C. 154(b) by 353 days.

(21) Appl. No.: 18/626,319

(22) Filed: Apr. 3, 2024

(65) Prior Publication Data

US 2024/0251684 A1 Jul. 25, 2024

Related U.S. Application Data

(63) Continuation-in-part of application No. PCT/CN2023/081252, filed on Mar. 14, 2023.

(30) Foreign Application Priority Data

May 27, 2022 (CN) ........................ 202210592128.6

(51) Int. Cl.
*H10N 50/01* (2023.01)
*G11C 11/16* (2006.01)
(Continued)

(52) U.S. Cl.
CPC ........... *H10N 50/01* (2023.02); *G11C 11/161* (2013.01); *H10B 61/22* (2023.02); *H10N 50/10* (2023.02); *H10N 50/80* (2023.02)

(58) Field of Classification Search
CPC ........ H10N 50/01; H10N 50/10; H10N 50/80; G11C 11/161; G11C 11/16; H10B 61/22; H10B 61/00
See application file for complete search history.

(56) References Cited

U.S. PATENT DOCUMENTS

2014/0269038 A1* 9/2014 Shimomura ........ G11C 11/1673 365/158

FOREIGN PATENT DOCUMENTS

| | | | | | |
|---|---|---|---|---|---|
| CN | 111384235 | A | | 7/2020 | |
| JP | 2014053546 | A | * | 3/2014 | |
| JP | 2016129206 | A | * | 7/2016 | ........... G11C 11/161 |

OTHER PUBLICATIONS

International Search Report, with English translation, and Written Opinion of International Searching Authority for International Patent Application No. PCT/CN2023/081252, mailed May 26, 2023 (9 pages).

(Continued)

*Primary Examiner* — Eliseo Ramos Feliciano
*Assistant Examiner* — Sophia W Kao
(74) *Attorney, Agent, or Firm* — Nixon Peabody LLP

(57) ABSTRACT

Provided are a magnetic random access memory device and a manufacturing method therefor. The device comprises magnetic thin film structure bodies, and an electrode arranged around side surfaces of the magnetic thin film structure body. The method is: preparing a bottom electrode, preparing a magnetic thin film structure body on the bottom electrode; preparing a non-magnetic thin film structure body on the magnetic thin film structure body, and preparing another magnetic thin film structure body on the non-
(Continued)

magnetic thin film structure body; etching the two magnetic thin film structure bodies and the non-magnetic thin film structure body to form a MTJ device, preparing an insulating layer thin film on the outer surface of the device, and preparing a VCMA electrode on the periphery of the side face of the magnetic thin film structure body requiring voltage application; and preparing a wire connecting the VCMA electrode to outside.

7 Claims, 28 Drawing Sheets

(51) Int. Cl.

| | |
|---|---|
| ***H10B 61/00*** | (2023.01) |
| ***H10N 50/10*** | (2023.01) |
| ***H10N 50/80*** | (2023.01) |

(56) References Cited

OTHER PUBLICATIONS

Krizakova, V. et al.; "Interplay of Voltage Control of Magnetic Anisotropy, Spin-Transfer Torque, and Heat in the Spin-Orbit-Torque Switching of Three-Terminal Magnetic Tunnel Junctions"; Physical Review Applied, vol. 15, 054055; Jun. 9, 2021; DOI: 10.1103/PhysRevApplied.15.054055 (14 pages).

* cited by examiner

MAGNETIC TUNNEL JUNCTION-BASED MAGNETIC RANDOM ACCESS MEMORY DEVICE AND MANUFACTURING METHOD THEREFOR

CROSS-REFERENCE TO RELATED APPLICATIONS

This application is a continuation-in-part of International Patent Application No. PCT/CN2023/081252, filed on Mar. 14, 2023, which claims the benefit of and priority to Chinese Patent Application No. 202210592128.6, filed with the Chinese Patent Office on May 27, 2022, each of which is hereby incorporated by reference herein in its entirety.

TECHNICAL FIELD

The present disclosure relates to the field of memory chips in integrated circuits, and in particular to a magnetic random access memory device and a manufacturing method therefor.

BACKGROUND

Due to factors such as the short-channel effect caused by miniaturization, the standby energy consumption (i.e., volatility) of random access memories (e.g., SRAM (static random access memory) and DRAM (dynamic random access memory)) based on MOSFET (metal-oxide-semiconductor field effect transistor) below 20 nm technology node is relatively serious. Memory chips in a new generation of integrated circuits need to use novel-principle devices with non-volatility. Magnetic random access memory (MRAM) based on magnetic tunnel junction (MTJ) of spintronic devices is the most promising memory chip used widely in the new generation of integrated circuits. The performance of MTJ is mainly determined by the information write-in method. The spin transfer torque (STT) method, which has been widely used and already applied in small-scale products, become a major obstacle to its large-scale application in integrated circuits due to its high energy consumption caused by information writing and a resultant deterioration in endurance. Spin orbit torque (SOT), which is a popular information write-in method recently, requires a long spin Hall channel due to low information write-in energy, leading to a relatively large device size and difficulty of preparing high-integration memory chips. The voltage controlled magnetic anisotropy (VCMA) as another write-in method, is difficult to be applied because its write-in principle determines a high error rate of information writing. In addition, it should be pointed out that, for the existing VCMA, due to the problems of manufacturing process, the component to which the voltage is applied by the VCMA is usually a cross section of a vertical columnar ferromagnetic system including an insulating layer, rather than the peripheral side surfaces of the vertical columnar ferromagnetic system.

At present, there is a proposal in the literature to write information to MTJ by using STT and VCMA together, but the position to which the voltage is applied by the VCMA is at an interface, containing an insulating layer, in a thin film face of a free layer of the MTJ as previously mentioned (PHYSICAL REVIEW APPLIED. 15, 2021, 054055), rather than around the side surfaces of the MTJ as proposed in the present invention. The biggest problems of such a structure is that the correctness of its physical mechanism because it is impossible to explain physically whether the STT effect has already contained VCMA, that is, it is impossible to distinguish which part of the voltage and how much voltage may perform STT spin transmission, which part of the voltage and how much voltage may produce VCMA. Moreover, another problem is that the VCMA of the device with such a structure also acts on the non-magnetic thin film structure body actually, so the endurance of the MTJ cannot be improved.

In conclusion, it is necessary to further innovate the prior art.

SUMMARY

Against the disadvantages in the prior art, the purpose of the present disclosure is to provide a magnetic random access memory device for writing information to a MTJ by using STT and VCMA together, and a manufacturing method thereof. The magnetic random access memory device is reasonable in structural design and simple in preparation process. A VCMA is generated from side surfaces of a magnetic thin film structure body, and will not affect the non-magnetic thin film structure body. Therefore it can reduce the magnetic anisotropy, thereby reducing information write-in energy consumption in STT writing mode, as well as improving the endurance of the non-magnetic thin film structure body.

The technical solution adopted by the present disclosure for solving the technical problem is as follows:

A magnetic random access memory device provided by the present disclosure includes a magnetic thin film structure body, and an electrode capable of applying a voltage to the magnetic thin film structure body to control magnetic anisotropy of the magnetic thin film structure body is arranged around side surfaces of the magnetic thin film structure body.

Further, the device includes two magnetic thin film structure bodies, and a non-magnetic thin film structure body sandwiched between the two magnetic thin film structure bodies. And side surfaces of one of the magnetic thin film structure bodies are provided with a VCMA electrode capable of applying a voltage to the magnetic thin film structure body to control the magnetic anisotropy of the magnetic thin film structure body.

In some embodiments, the two magnetic thin film structure bodies are both ferromagnetic thin film structure bodies. An insulating layer thin film is arranged around side surfaces of a structure body composed of the two ferromagnetic thin film structure bodies and the non-magnetic thin film structure body. An outer side surface of the insulating layer thin film is provided with a VCMA electrode capable of applying a voltage to one of the ferromagnetic thin film structure bodies to control the magnetic anisotropy.

In some embodiments, the VCMA electrode can be connected to the outer side surface of the insulating layer thin film by any one of connection modes comprising: completely surrounding the outer side surface of the insulating layer thin film, partially surrounding the outer side surface of the insulating layer thin film, and contacting with a part of the outer side surface of the insulating layer thin film.

In some embodiments, the VCMA electrode may be any one of a multilayer heterostructure composed of different materials, and a single structure composed of a same material.

In some embodiments, the VCMA electrode may employ a partial surrounding mode or two-part surrounding mode when employing the connection mode of partially surrounding the outer side surface of the insulating layer thin film.

In some embodiments, the VCMA electrode may employ a single-point contact mode or a multi-point contact mode when employing the contact connection mode of contacting with a part of the outer side surface of the insulating layer thin film.

In some embodiments, one magnetic random access memory device corresponds to the VCMA electrode, or a plurality of magnetic random access memory devices correspond to one VCMA electrode.

A manufacturing method for the magnetic random access memory device includes following steps: preparing a bottom electrode; preparing a magnetic thin film structure body on the prepared bottom electrode; preparing a non-magnetic thin film structure body on the prepared magnetic thin film structure body; and preparing another magnetic thin film structure body on the non-magnetic thin film structure body; and then etching the two magnetic thin film structure bodies and the non-magnetic thin film structure body to form a MTJ device, preparing an insulating layer thin film on an outer surface of the MTJ device, and preparing a VCMA electrode on side surfaces of the magnetic thin film structure body requiring voltage application; and finally, preparing a wire for connecting the VCMA electrode to the outside.

In some embodiments, the preparing an insulating layer thin film on an outer surface of the MTJ device and the preparing a VCMA electrode on side surfaces of the magnetic thin film structure body requiring voltage application include following steps:

(1.1) depositing the insulating layer thin film on a surface of the MTJ device;

(1.2) depositing an insulator isolation layer on a part of the MTJ device not requiring voltage application;

(1.3) depositing a sacrificial layer which has different etching selectivity ratio from the insulator isolation layer in Step (1.2) and is able to be etched away on a position of the MTJ device requiring voltage application, and etching the sacrificial layer to form a required pattern;

(1.4) depositing a insulator isolation layer on the sacrificial layer obtained in Step (1.3);

(1.5) depositing an electrode material on one end of the magnetic thin film structure body requiring voltage application, and etching the electrode material such that the electrode material has a non-overlapping part with the sacrificial layer etched in Step (1.3) in a top view angle, and then covering the non-overlapping part with an insulator isolation layer and polishing the insulator isolation layer flat;

(1.6) etching and punching a hole from a position above the sacrificial layer which is not overlapped with the electrode material in Step (1.5) until the hole contacts with the sacrificial layer, and etching away the sacrificial layer;

(1.7) depositing a VCMA electrode at a position where the sacrificial layer is etched away in Step (1.6); and (1.8) etching away redundant electrode material at the position of the hole in Step (1.6), depositing a wire for connecting the electrode material to the outside, and finally forming the VCMA electrode capable of applying a voltage to the magnetic thin film structure body.

In some embodiments, the preparing an insulating layer thin film on an outer surface of the MTJ device and the preparing a VCMA electrode on side surfaces of the magnetic thin film structure body requiring voltage application may include the following steps:

(2.1) depositing the insulating layer thin film on a surface of the MTJ device;

(2.2) depositing an insulator isolation layer and a VCMA electrode in one of two ways: depositing the insulator isolation layer on a part of the MTJ device not requiring voltage application and then depositing the VCMA electrode on periphery of the magnetic thin film structure body of the MTJ device requiring voltage application to a required thickness, and depositing the VCMA electrode on the periphery of the magnetic thin film structure body of the MTJ device requiring voltage application to a required thickness and then depositing the insulator isolation layer on the part of the MTJ device not requiring voltage application; and (2.3) covering the VCMA electrode obtained in Step (2.2) with an insulator isolation layer for protection.

In some embodiments, in Step (2.2), the VCMA electrode, after being deposited to a thickness exceeding that of the MTJ device, can be etched back to a required thickness.

In some embodiments, the preparing an insulating layer thin film on an outer surface of the MTJ device and the preparing a VCMA electrode on side surfaces of the magnetic thin film structure body requiring voltage application may include following steps:

(3.1) depositing the insulating layer thin film on a surface of the MTJ device;

(3.2) depositing a VCMA electrode on an outer surface of the insulating layer thin film; and (3.3) etching away redundant VCMA electrode to make the VCMA electrode surround periphery of the magnetic thin film structure body requiring voltage application.

With the above-mentioned technical solution, the present disclosure has the following benefits:

The magnetic random access memory device provided by the present disclosure has a reasonable structural design. A layer of insulating layer thin film is provided around side surfaces of the magnetic thin film structure body, a VCMA electrode capable of applying a voltage to the magnetic thin film structure body is added on the periphery of the insulating layer thin film, and a wire for connecting the VCMA electrode to the outside is also deposited on the VCMA electrode. The purpose of using VCMA is to control magnetic anisotropy (VCMA) of spinning electrons of the magnetic thin film structure body with voltage during information writing, and then making the VCMA and a STT mode working together during information write-in, thereby helping reducing the information write-in energy consumption in STT mode, and improving the endurance of the non-magnetic thin film structure body, thus making it suitable for promotion and application.

Other benefits of the present disclosure are further described in conjunction with the following embodiments

BRIEF DESCRIPTION OF THE DRAWINGS

To describe the technical solutions in the embodiments of the present disclosure or the prior art more clearly, the following briefly introduces the accompanying drawings required for describing the embodiments. Apparently, the accompanying drawings in the following description show merely some embodiments of the present disclosure, and those of ordinary skill in the art may still derive other drawings from these accompanying drawings without creative efforts.

FIG. 23A is a schematic diagram of a formation of a vertical columnar magnet; FIG. 23B is a schematic diagram of a deposition of an insulating layer thin film; FIG. 23C is a schematic diagram of a deposition of a VCMA electrode; and FIG. 23D is a schematic diagram of a formation of an insulator isolation layer for covering an electrode;

FIG. 24A is a schematic diagram of a formation of a VCMA electrode thin film on a surface of an insulating film; FIG. 24B is a schematic diagram of an etching of redundant electrode at an upper part; and FIG. 24C is a schematic diagram of a formation of an insulator isolation layer for covering an electrode.

DETAILED DESCRIPTION OF THE EMBODIMENTS

Figure 1:
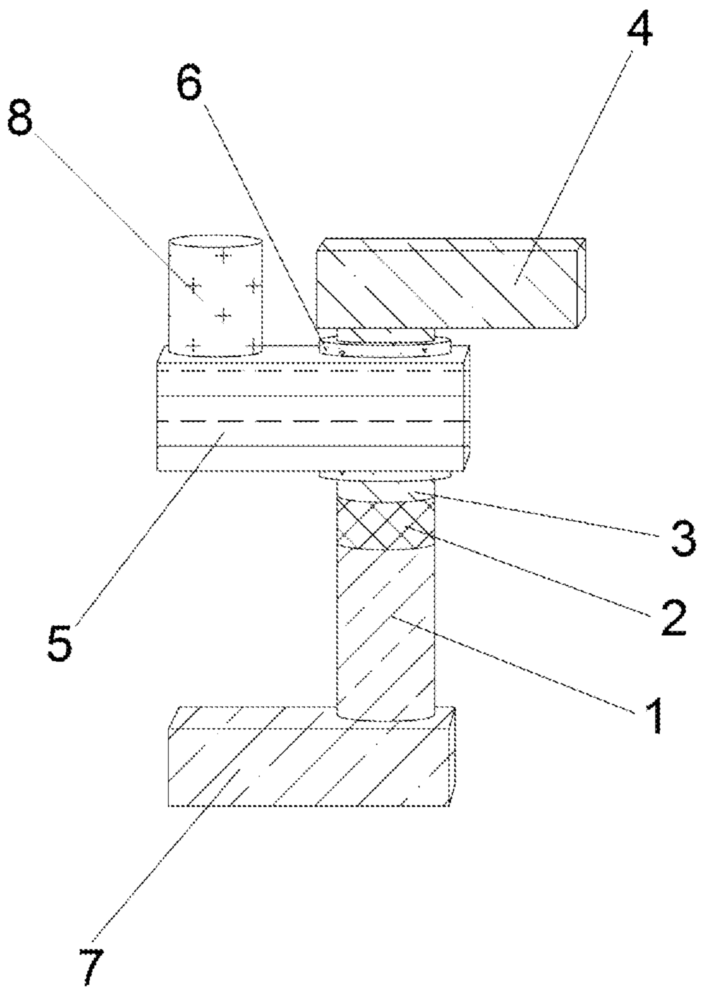
FIG. 1 is a structural schematic diagram of a magnetic random access memory device according to embodiments of the present disclosure.

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

In the description of the present disclosure, it needs to be understood that the orientation or positional relationship indicated by terms “upper”, “lower”, “horizontal”, “inside”, “outside”, “top” and “bottom” is based on the orientation or positional relationship shown in the drawings only for convenience of description of the present disclosure and simplification of description rather than indicating or implying that the device or element referred to must have a particular orientation, be constructed and operate in a particular orientation, and thus are not to be construed as limiting the present disclosure.

In the present disclosure, it should be noted that, unless expressly specified and limited otherwise, the terms “form” and “connect” should be understood broadly, e.g., may be either a fixed connection or a detachable connection, or a connection in one piece; may be a direct connection or an indirect connection through an intermediate medium. For those of ordinary skill in the art, the specific meanings of the above terms in the utility model can be understood on a case-by-case basis.

The present disclosure is further described below with reference to specific embodiments.

FIG. 1 is a structure of a magnetic random access memory device, i.e., a structural schematic diagram of a magnetic random access memory device for writing information to a MTJ by using VCMA and STT together. As shown in FIG. 1, the magnetic random access memory device according to embodiments of the present disclosure includes a fixed layer 1, a tunnel insulating layer 2, a free layer 3, a free layer electrode 4, a VCMA electrode 5, an insulating layer thin film 6, a fixed layer electrode 7, and a wire 8.

Each of the fixed layer 1 and the free layer 3 is called a magnetic thin film structure body (the magnetic thin film structure body may be composed of a layer of magnetic thin film, or multiple layers of magnetic thin films, or a layer of magnetic thin film and a layer of non-magnetic thin film layer, or multiple layers of magnetic thin films and the non-magnetic thin film layer). The insulating layer thin film 6 may be an oxide protective film.

The fixed layer 1 may also be a magnetic thin film structure body composed of a magnetic thin film and a related auxiliary thin film (the magnetic thin film structure body may be composed of a layer of magnetic thin film, or multiple layers of magnetic thin films, or a layer of magnetic thin film and a layer of non-magnetic thin film layer, or multiple layers of magnetic thin films and the non-magnetic thin film layer).

The tunnel insulating layer 2 is arranged on the fixed layer 1, and the tunnel insulating layer 2 is a non-magnetic thin film structure body (which may be any one of a multi-layer heterostructure composed of different materials, and a single structure composed of a same material). The non-magnetic thin film structure body is a substance other than magnetic substance. The tunnel insulating layer 2 is usually MgO or the like.

The free layer 3 may also be a magnetic thin film structure body composed of a magnetic thin film and a related auxiliary thin film (the magnetic thin film structure body may be may be composed of a layer of magnetic thin film, or multiple layers of magnetic thin films, or a layer of magnetic thin film and a layer of non-magnetic thin film layer, or multiple layers of magnetic thin films and the non-magnetic thin film layer), which is arranged at the top of the tunnel insulating layer 2.

The magnetic thin film structure body in Embodiment 1 is a ferromagnetic thin film structure body. The ferromagnetic thin film structure body may be composed of a layer of ferromagnetic thin film, or multiple layers of ferromagnetic thin films, or a layer of ferromagnetic thin film and a layer of non-ferromagnetic thin film, or multiple layers of ferromagnetic thin films and the non-ferromagnetic thin film layer. The ferromagnetic thin film is usually CoFeB alloy or the like. A magnetic material selected for the magnetic thin film structure body is a strong magnetic substance with magnetic order, and generally includes weak magnetic and anti-ferromagnetic substances with available magnetism and magnetic effects.

One end of the free layer electrode 4 is connected to a top end of the free layer 3, and the other end of the free layer electrode 4 extends outward.

The fixed layer 1, the tunnel insulating layer 2 and the free layer 3 are etched to form a MTJ device. The insulating layer thin film 6 (which may be single-layer, or a thin film composed of multiple layers of different materials) is provided around the side surfaces of the MTJ device. The MTJ device aforementioned is a generalized MTJ device, which refers to a structural element composed of two ferromagnetic thin films and an insulating layer with a thickness of several nanometers or less sandwiched between the two ferromagnetic thin films. Specifically, the generalized MTJ device is composed of two magnetic thin film structure bodies and a non-magnetic thin film structure body sandwiched between the two magnetic thin film structure bodies. A side of one of the magnetic thin film structure body is provided with a VCMA electrode capable of applying a voltage to the magnetic thin film structure body to control magnetic anisotropy of the magnetic thin film structure body.

One end of the VCMA electrode 5 surrounds an outer layer of the insulating layer thin film 6 covering on the peripheral side surfaces of the free layer 3, the other end of the VCMA electrode extends outwards, and an upper part of the extension end is provided with a wire deposition hole 51. The VCMA electrode 5 and the free layer electrode 4 have a non-overlapping part in the top view angle and bottom view angle. The VCMA electrode 5 cannot contact with the free layer electrode 4.

Multilayer conductive or non-conductive thin films with different compositions can be deposited between the insulating layer thin film 6 and the VCMA electrode 5. The VCMA electrode 5 may employ a multilayer heterostructure composed of different materials, or a single structure composed of a same material. The VCMA electrode 5 may completely surround the outer surface of the insulating layer thin film, or partially surround the outer surface of the insulating layer thin film, or contact with a part of the outer surface of the insulating layer thin film.

The fixed layer electrode 7 is used to apply a voltage to the fixed layer 1, one end of the fixed layer electrode 7 is fixedly connected to the bottom of the fixed layer 1, and the other end of the fixed layer electrode 7 extends away from the fixed layer at any angle.

One end of the wire 8 is deposited into the wire deposition hole 51 at the other end of the VCMA electrode 5, and the other end of the wire 8 penetrates into the insulator isolation layer.

As shown in FIG. 3 to FIG. 22, a manufacturing method for a magnetic random access memory device includes the following steps: preparing a fixed layer electrode 7 at the bottom, preparing a fixed layer 1 on the prepared fixed layer electrode 7, preparing a tunnel insulating layer 2 on the prepared fixed layer 1, and preparing a free layer 3 on the prepared tunnel insulating layer 2; then, etching the fixed layer 1, the tunnel insulating layer 2 and the free layer 3 to form a MTJ device, preparing an insulating thin film on the MTJ device for protection, and preparing a VCMA electrode 5 around the side surfaces of the free layer 3 for applying a voltage to the free layer 3; and preparing a free layer electrode 4 at a top end of the free layer 3, and finally, preparing a wire 8 for connecting the VCMA electrode 5 to the outside.

Figure 2:
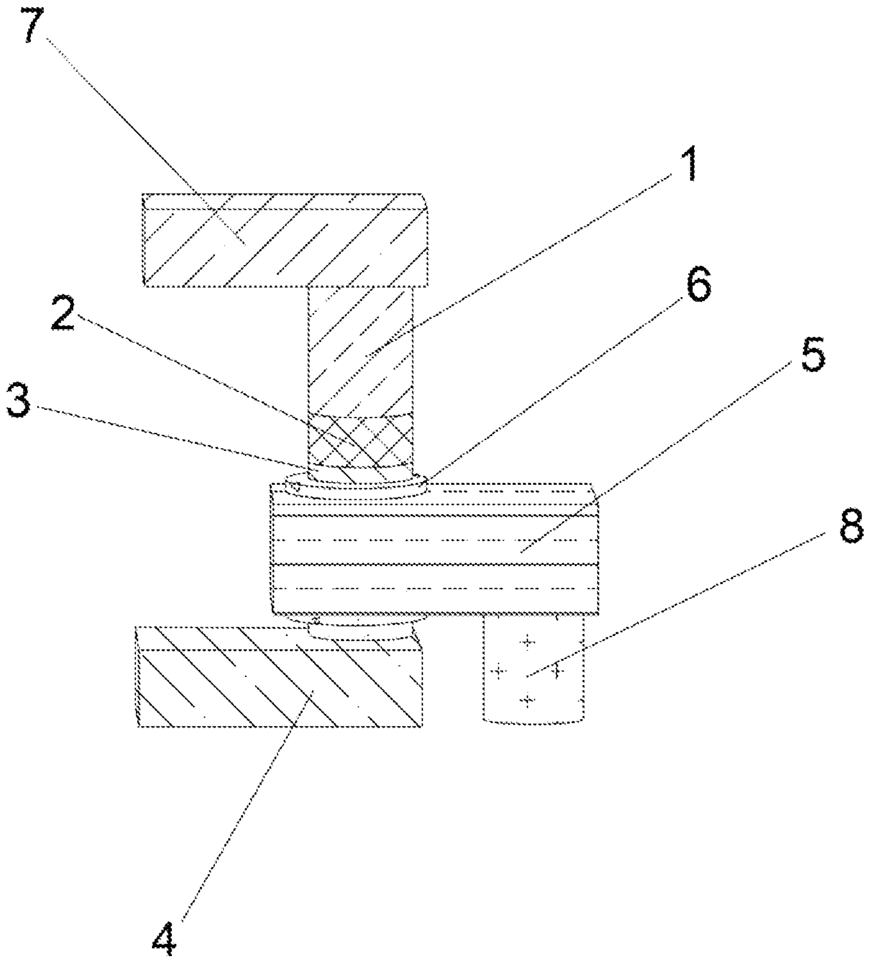
FIG. 2 is another structural schematic diagram of a magnetic random access memory device according to embodiments of the present disclosure.

As shown in FIG. 1, the fixed layer 1 of the magnetic random access memory device in Embodiment 1 of the present disclosure is arranged at the lower part, and the free layer 3 is arranged at an upper part. FIG. 2 is another structure of the magnetic random access memory device, i.e., another structure of an information storage device for writing information to a MTJ with the VCMA and STT. As shown in FIG. 2, in another embodiment of the magnetic random access memory device, the free layer 3 is arranged at the lower part, the fixed layer 1 is arranged at the upper part. In this case, the structure and the manufacturing method of the magnetic random access memory device in this embodiment can be obtained by making corresponding adjustment based on the structure and manufacturing method in Embodiment 1.

A preparation method for a magnetic random access memory device in Embodiment 1 specifically includes the following steps S11 to S30.

Figure 3:
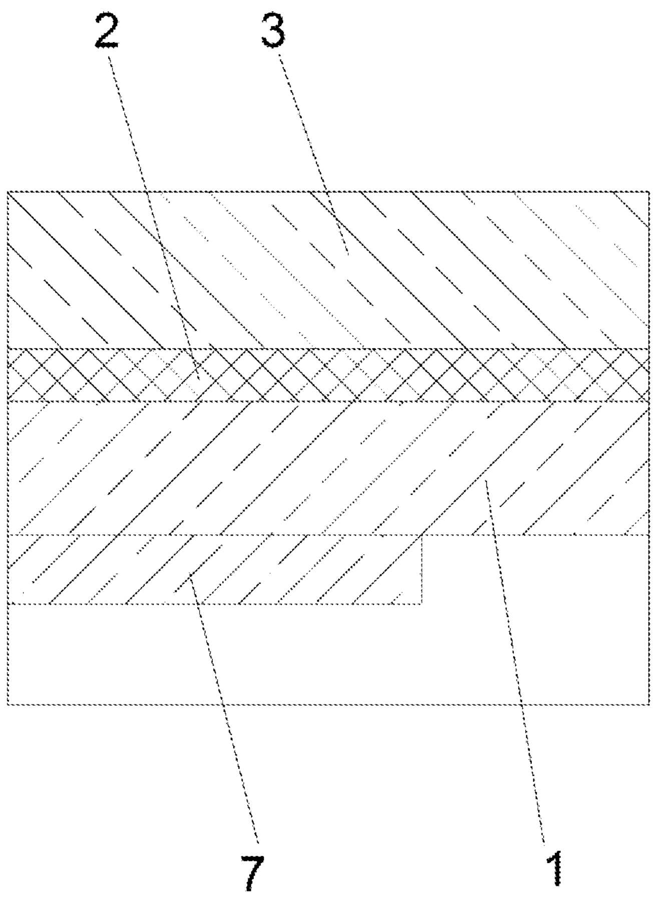
FIG. 3 is a schematic diagram of a preparation of a MTJ bottom electrode and a MTJ multi-layer film according to embodiments of the present disclosure.

In step S11, as shown in FIG. 3, a fixed layer electrode 7 at the bottom is firstly prepared, a multi-layer thin film layer of a MTJ is prepared on the fixed layer electrode 7 (which may also be a metal wire layer of a MOSFET or CMOS (complementary metal oxide semiconductor transistor) logic circuit below the MTJ for controlling the on-off of the MTJ), that is, a fixed layer 1 is prepared on the fixed layer electrode 7, a tunnel insulating layer 2 is prepared on the fixed layer 1, and a free layer 3 is prepared on the tunnel insulating layer 2.

Figure 4:
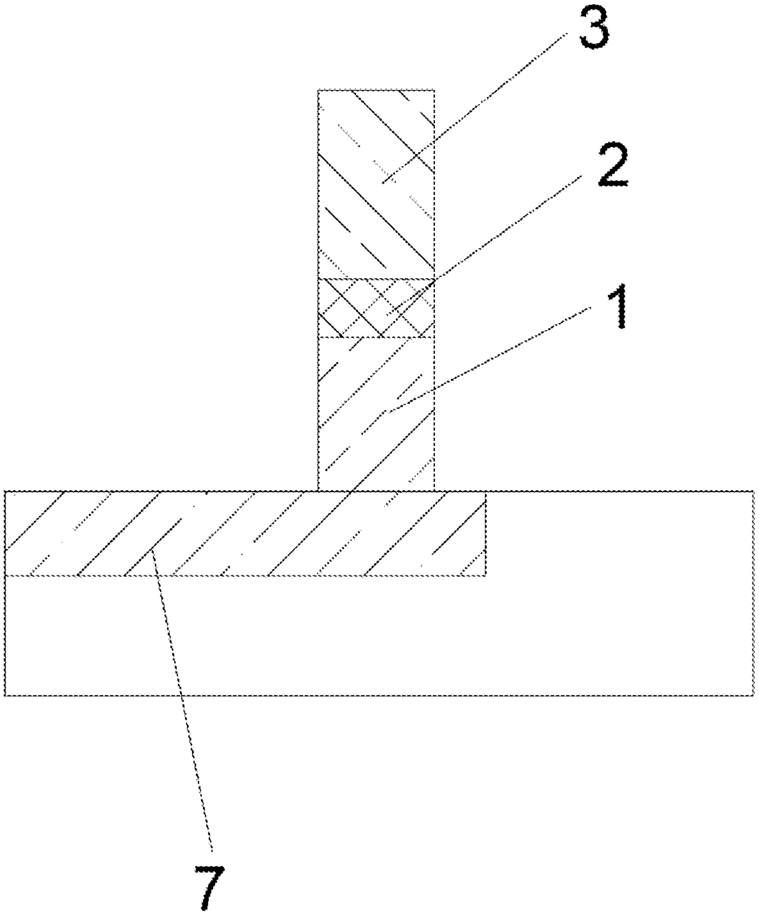
FIG. 4 is a schematic diagram of a formation of a vertical columnar MTJ device according to embodiments of the present disclosure.

In step S12, as shown in FIG. 4, the fixed layer 1, the tunnel insulating layer 2 and the free layer 3 are etched to form a vertical columnar MTJ device, which is ideally cylindrical, but is actually prepared into frustum-shaped through the existing semiconductor process.

Figure 5:
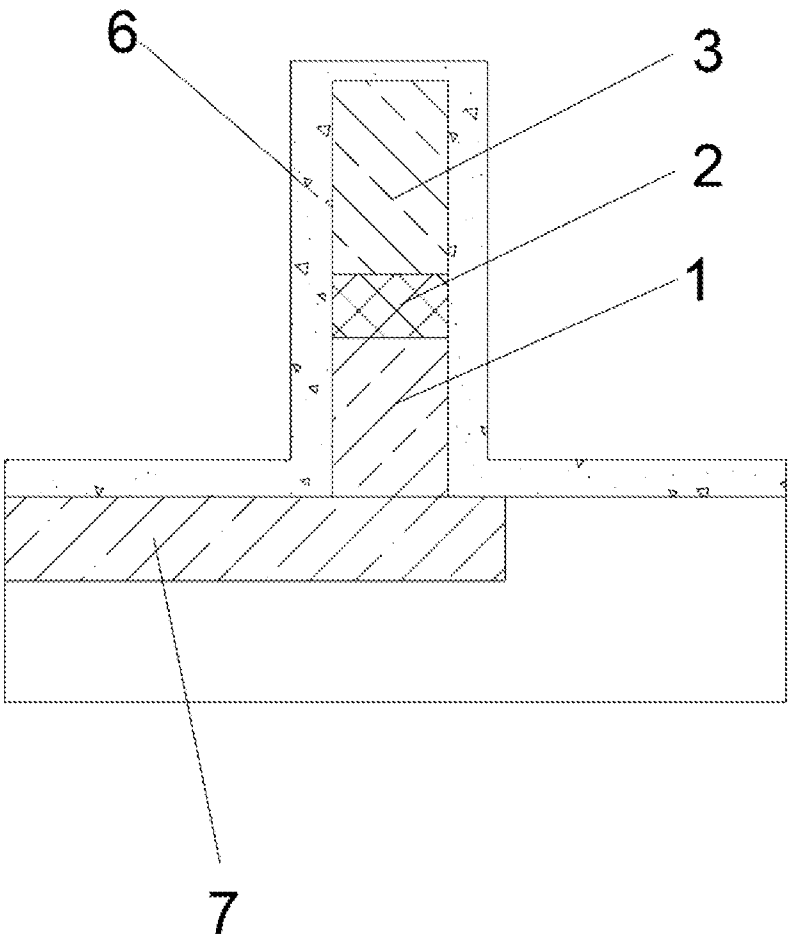
FIG. 5 is a schematic diagram of a formation of an insulating layer protective film according to embodiments of the present disclosure.

In step S13, as shown in FIG. 5, a layer of insulating layer thin film 6 is deposited on a surface of the MTJ device.

Figure 6:
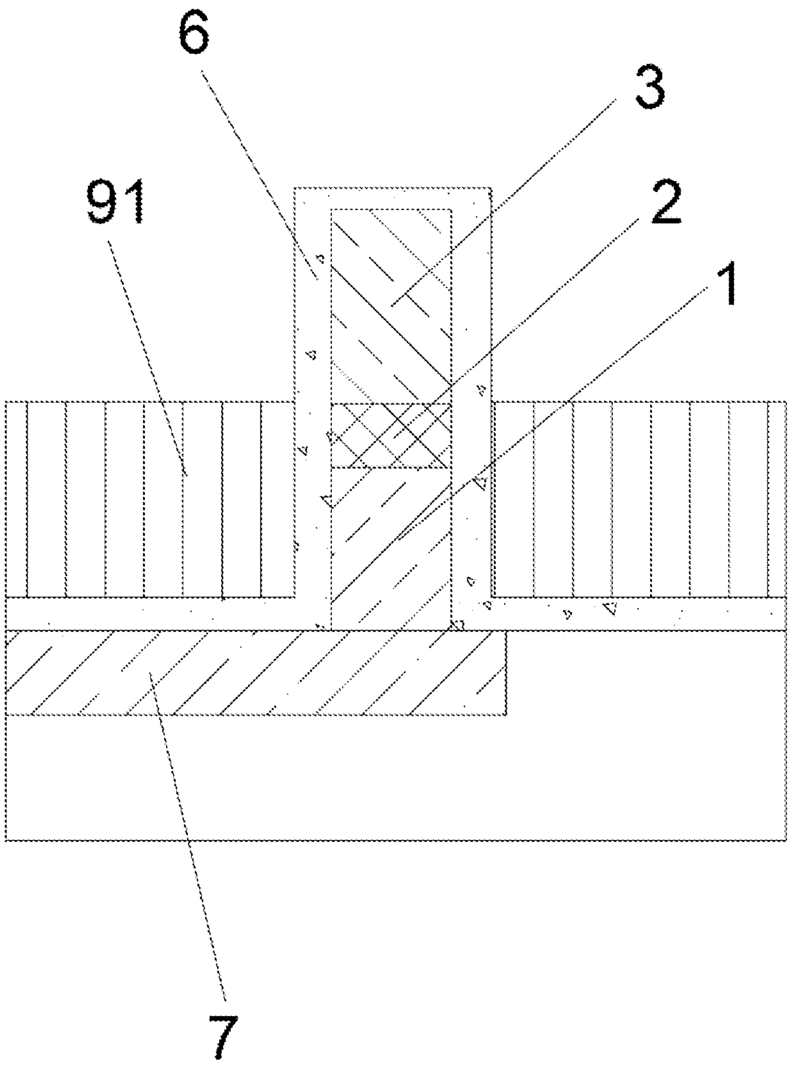
FIG. 6 is a schematic diagram of a formation of a protective layer $SiO_2$ of a tunnel insulating layer and a fixed layer according to embodiments of the present disclosure.

In step S14, as shown in FIG. 6, an insulator isolation layer 91 is filled around the fixed layer 1, where the insulator isolation layer 91 may be deposited until the thickness of the insulator isolation layer 91 exceeds the height of the MTJ device, and then the insulator isolation layer 91 is etched back to a flat interface as shown in FIG. 6 by CMP.

Figure 7:
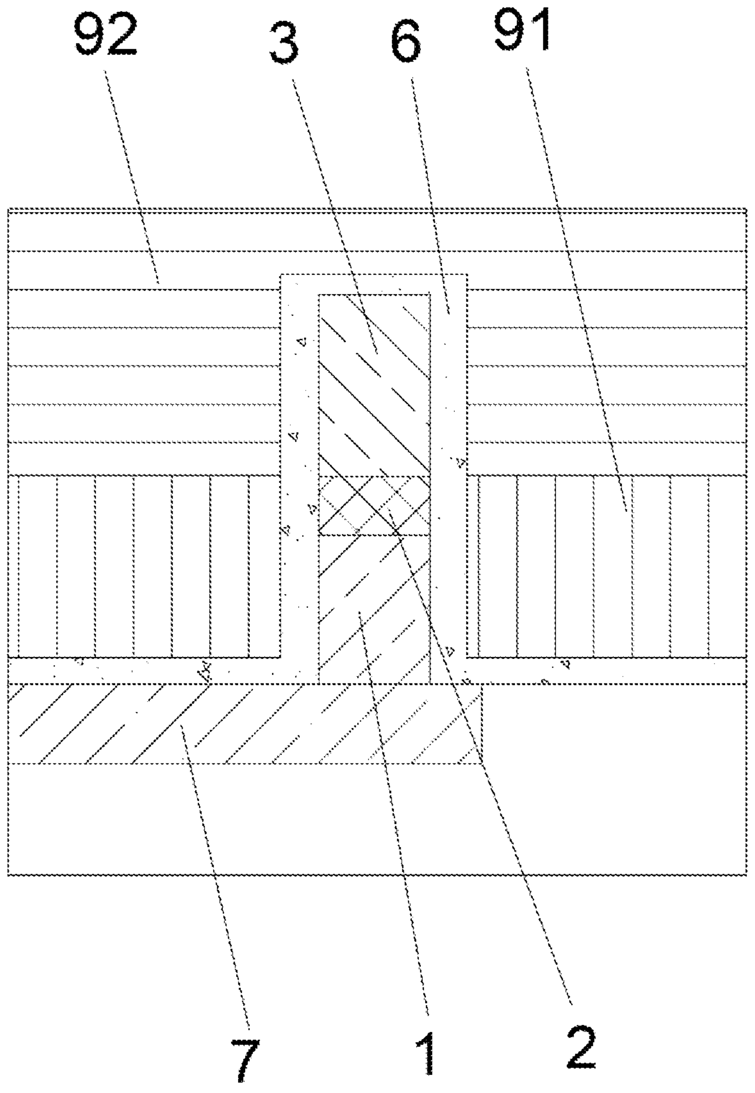
FIG. 7 is a schematic diagram of a deposition of a $Si_3N_4$ sacrificial thin film according to embodiments of the present disclosure.

In step S15, as shown in FIG. 7, a sacrificial layer 92 (e.g., $Si_3N_4$) is deposited at the periphery of the insulating layer thin film 6 on the upper surface of the insulator isolation layer 91 until the thickness of the sacrificial layer 92 exceeds the height of the MTJ device, and then the sacrificial layer 2 is polished by CMP.

Figure 8:
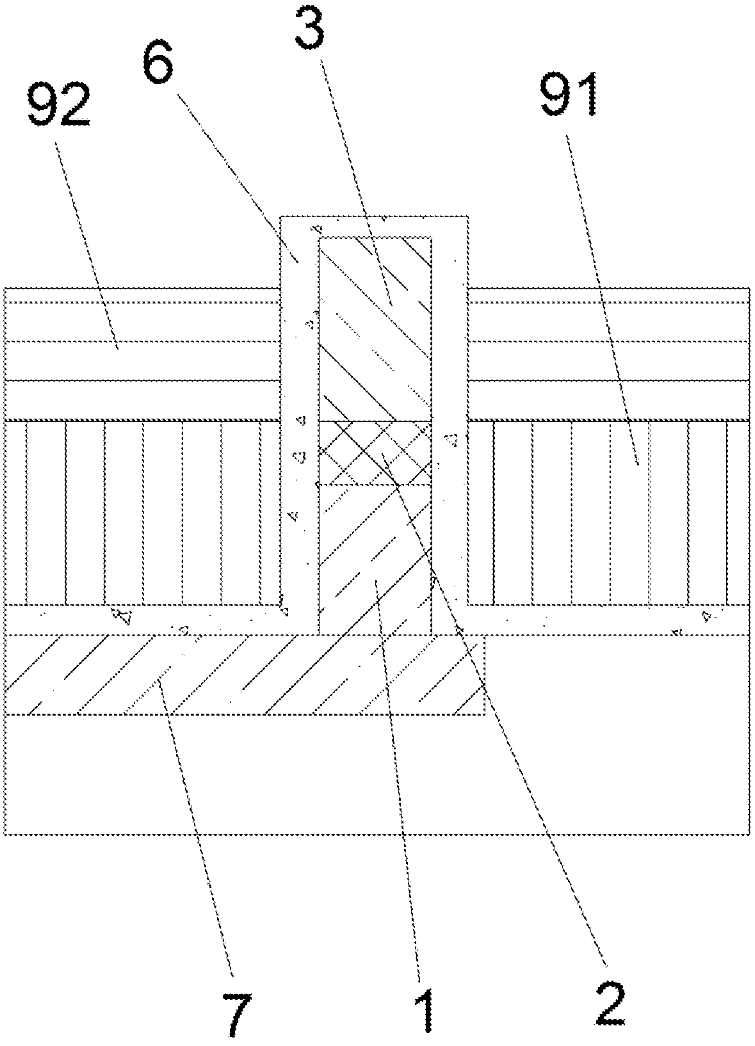
FIG. 8 is a schematic diagram of etching back of a $Si_3N_4$ sacrificial thin film according to embodiments of the present disclosure.

In step S16, as shown in FIG. 8, the sacrificial layer 92 is etched back to a target thickness.

Figure 9:
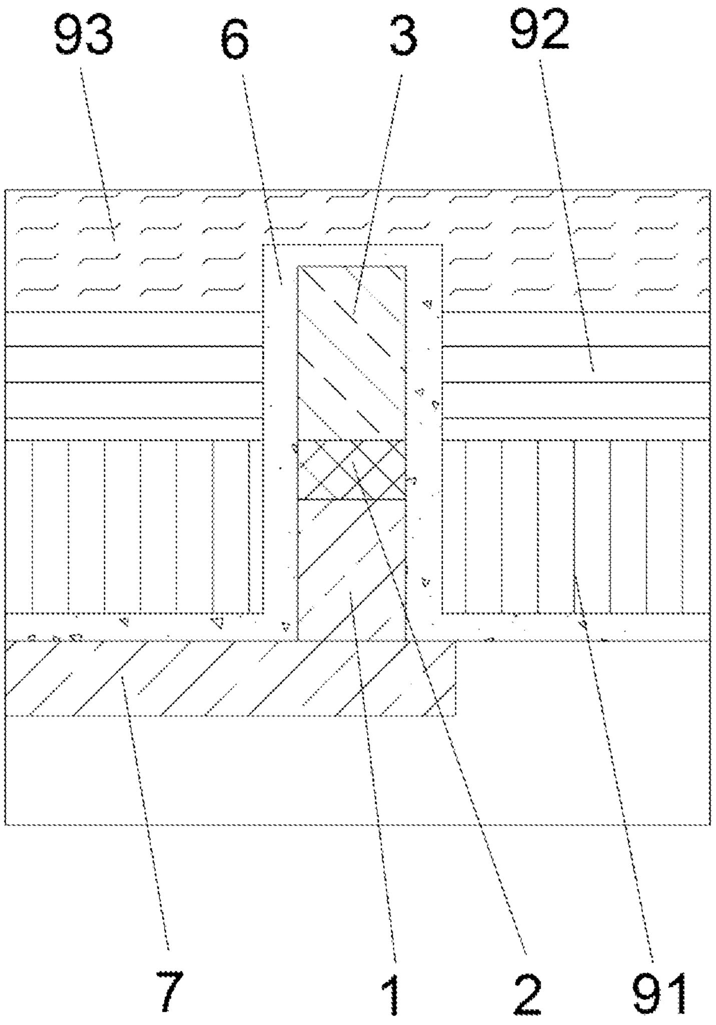
FIG. 9 is a schematic diagram of a formation of a photoresist layer according to embodiments of the present disclosure.

In step S17, as shown in FIG. 9, a photoresist layer 93 is deposited on the periphery of the insulating layer thin film 6 on the upper surface of the sacrificial layer 92 obtained in Step S16 until a thickness of the photoresist layer 93 exceeds the height of the MTJ device, and then the sacrificial layer 92 is subjected to etching and other related treatment to form a required pattern.

Figure 10:
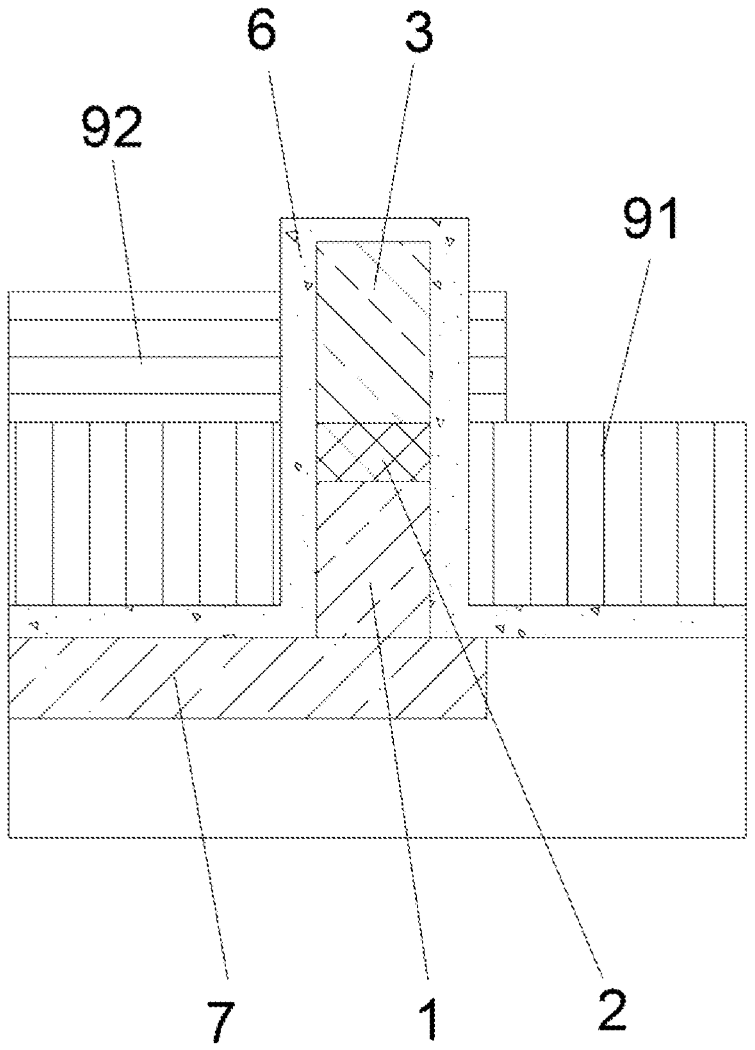
FIG. 10 is a schematic diagram of an etching of a sacrificial layer according to embodiments of the present disclosure.

In step S18, as shown in FIG. 10, the redundant sacrificial layer 92 is etched away.

Figure 11:
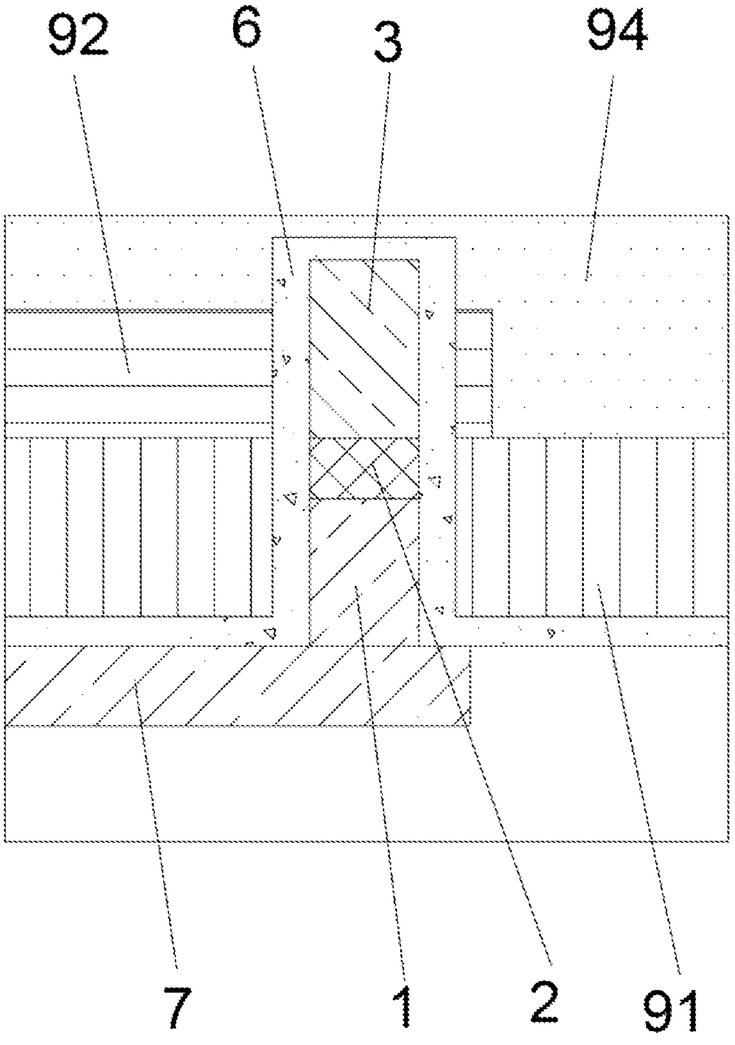
FIG. 11 is a schematic diagram of a formation and planarization of a $SiO_2$ covering layer according to embodiments of the present disclosure.

In step S19, as shown in FIG. 11, an insulator isolation layer 94 is deposited on the periphery of the sacrificial layer 92 obtained in Step S18 until a thickness of the insulator isolation layer 94 exceeds the height of the MTJ device, and then the insulator isolation layer 94 is polished by CMP.

Figure 12:
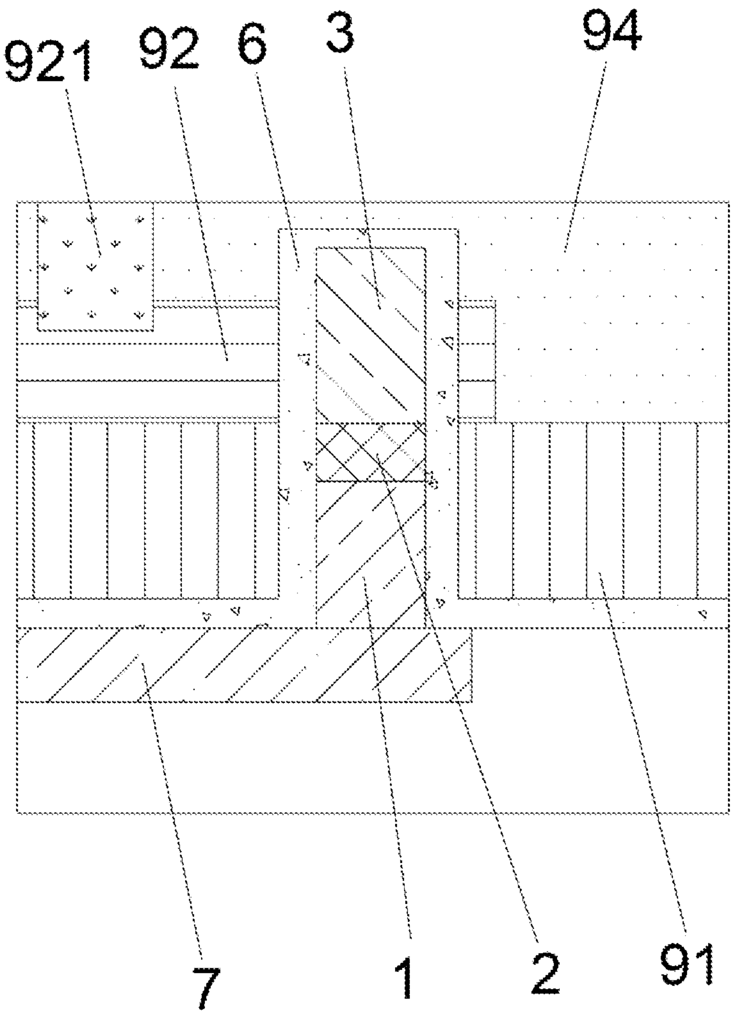
FIG. 12 is a schematic diagram of etching and punching according to embodiments of the present disclosure.

In step S20, as shown in FIG. 12, a hole 921 is punched on the upper part of the sacrificial layer 92 obtained in Step S18.

Figure 13:
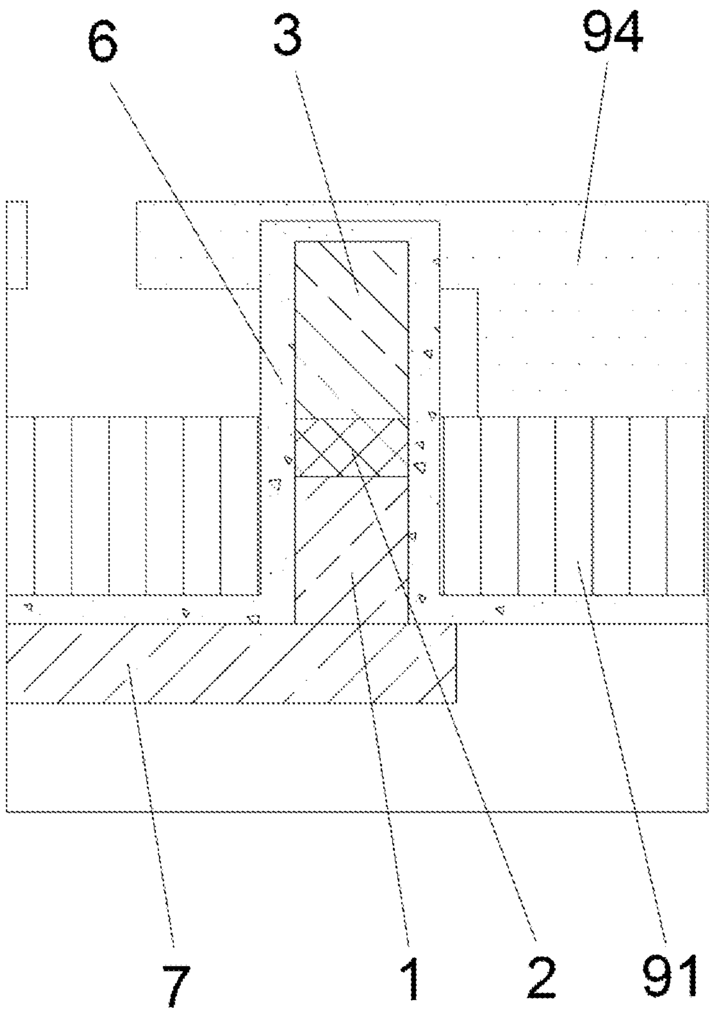
FIG. 13 is a schematic diagram of etching away of a sacrificial layer according to embodiments of the present disclosure.

In step S21, as shown in FIG. 13, the sacrificial layer 92 obtained in Step S20 is etched away.

Figure 14:
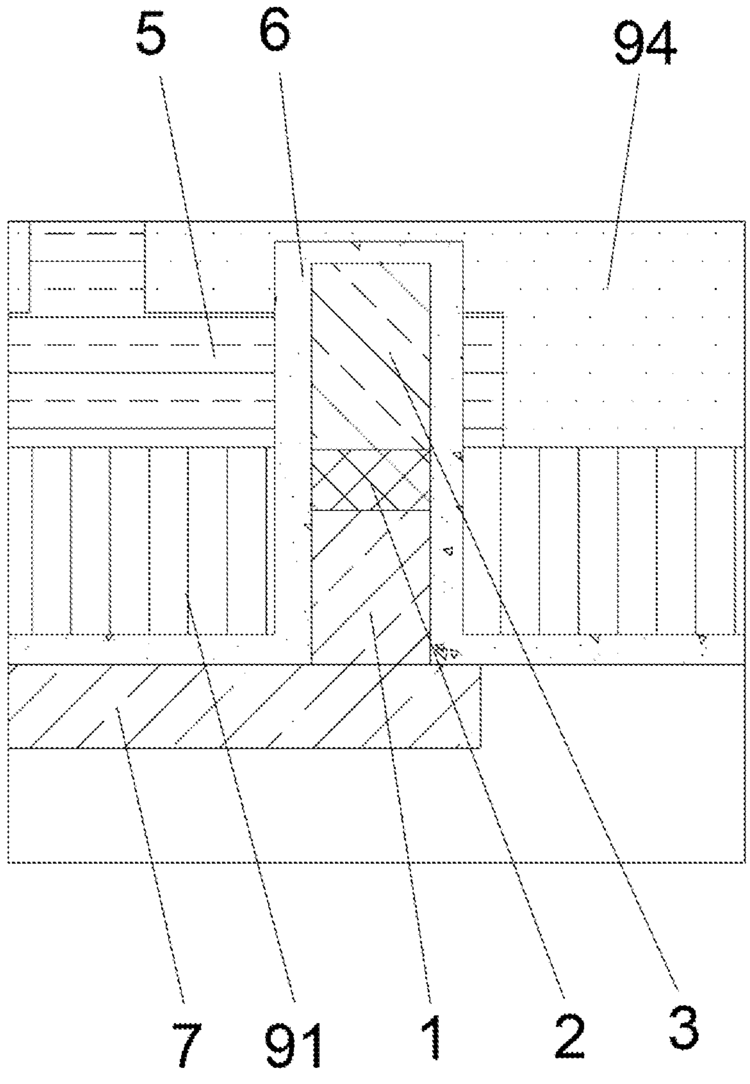
FIG. 14 is a schematic diagram of a deposition of a VCMA electrode according to embodiments of the present disclosure.

In step S22, as shown in FIG. 14, a VCMA electrode 5 capable of applying a voltage to the free layer 3 is deposited; the VCMA electrode 5 here may be a multi-layer hetero-structure composed of different materials, or a single structure composed of a same material. Prior to the deposition of the VCMA electrode 5, another oxide insulating layer, such as high-K oxide, may be deposited. In addition, prior to the deposition of the VCMA electrode 5, other insulating oxides can be deposited after the previously deposited oxide insulating layer in contact with the MTJ device is etched away, and then the VCMA electrode 5 is deposited.

Figure 15:
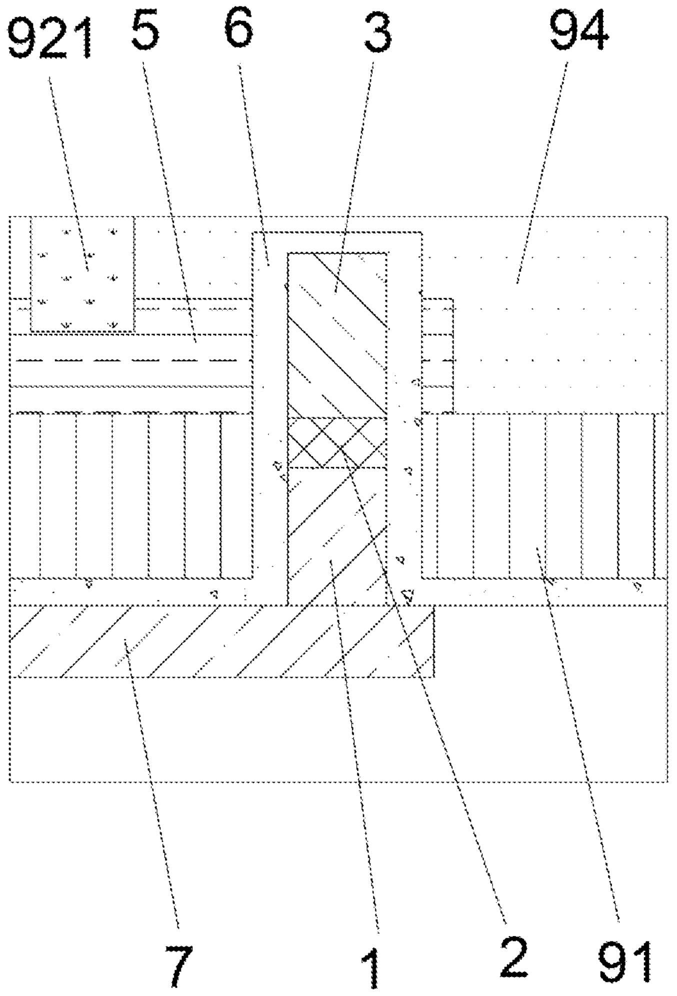
FIG. 15 is a schematic diagram of removal of an electrode material in a hole by punching according to embodiments of the present disclosure.

In step S23, as shown in FIG. 15, the VCMA electrode 5 located in the hole 921 in Step S20 is etched away.

Figure 16:
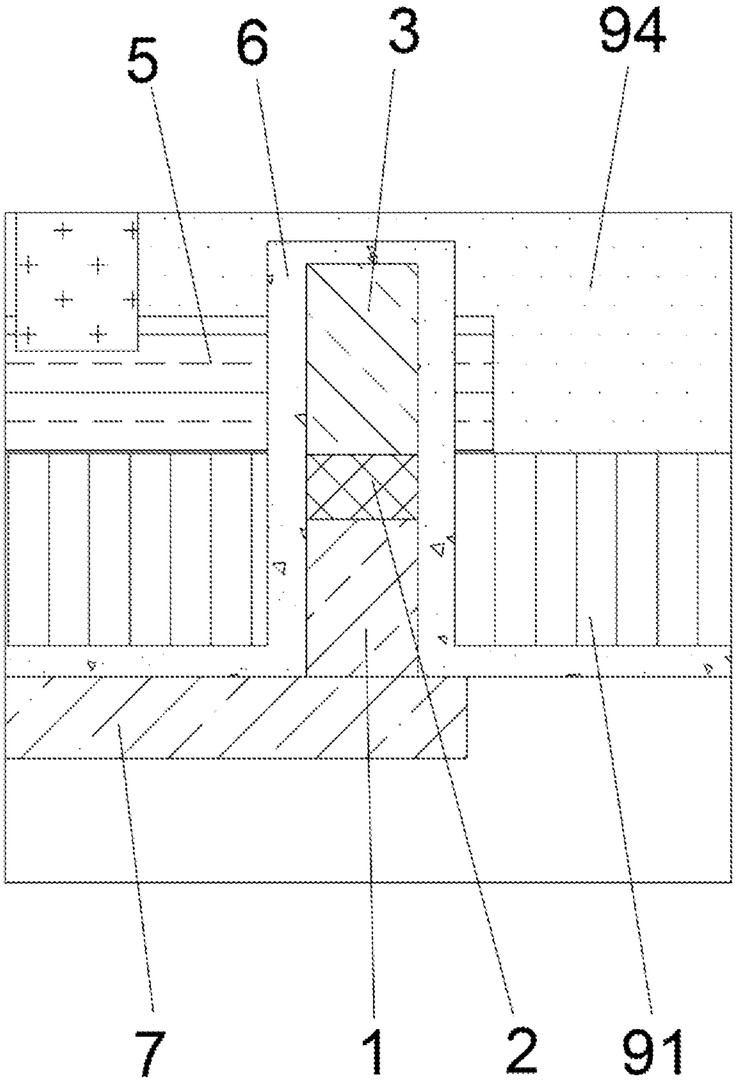
FIG. 16 is a schematic diagram of filling a hole with an insulator according to embodiments of the present disclosure.

In step S24, as shown in FIG. 16, the hole 921 obtained in Step S20 is filled with the insulator isolation layer 94.

Figure 17:
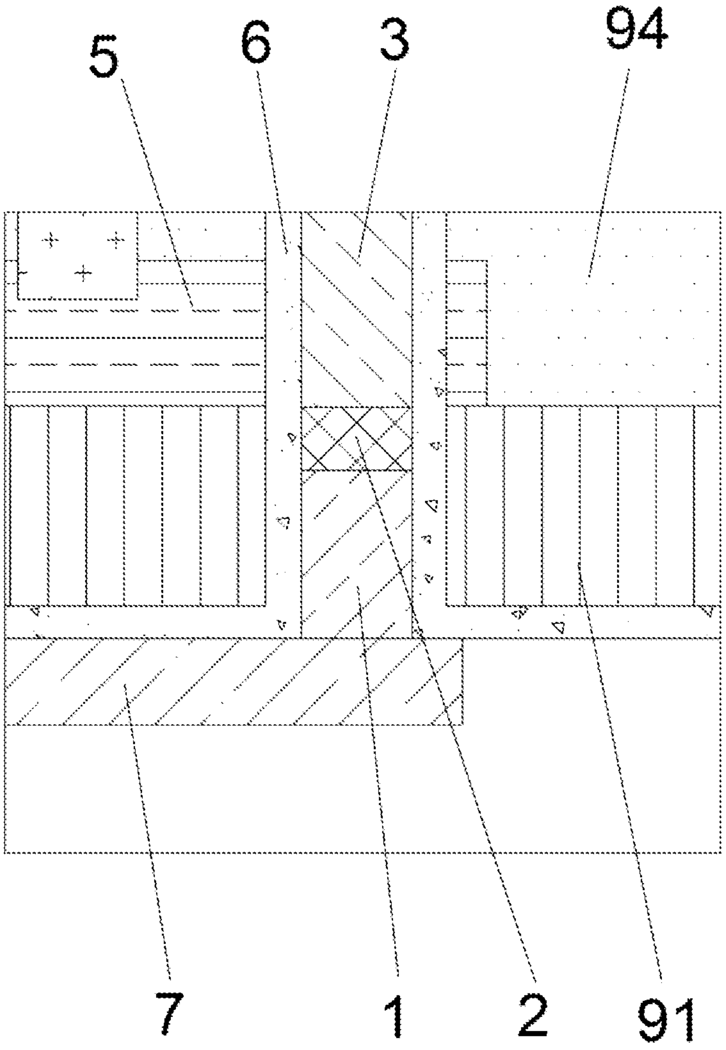
FIG. 17 is a schematic diagram showing polishing by CMP (chemical mechanical polishing) until a free layer is exposed according to embodiments of the present disclosure.

In step S25, as shown in FIG. 17, the insulator isolation layer 94 is polished by CMP until the top of the free layer 3 is exposed.

Figure 18:
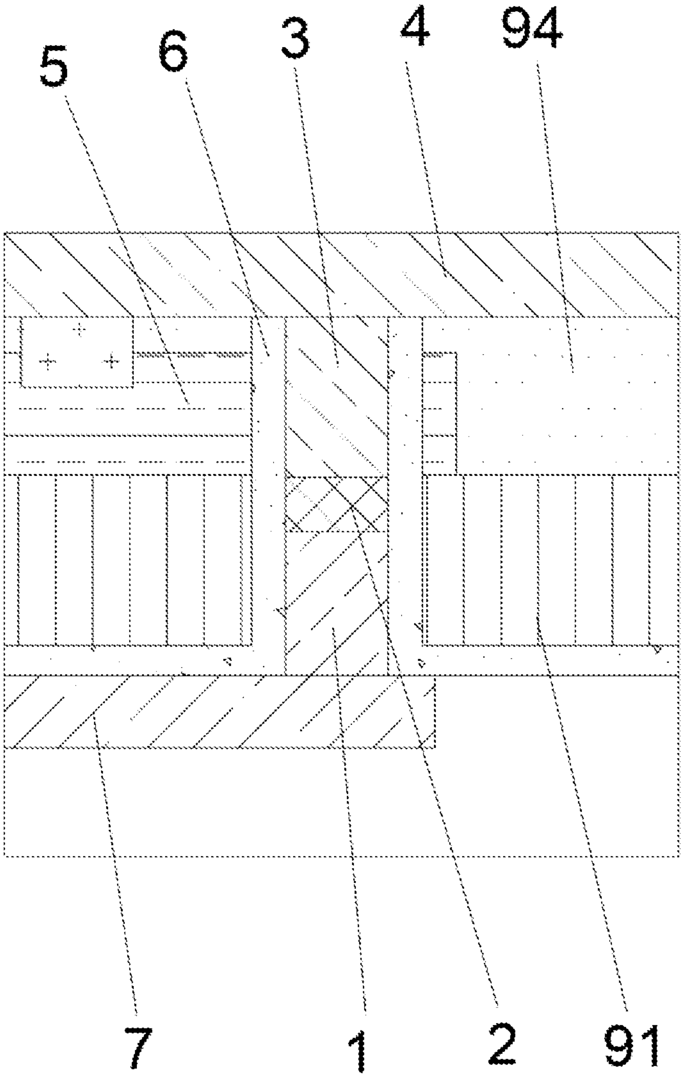
FIG. 18 is a schematic diagram of a formation of a free layer electrode according to embodiments of the present disclosure.

In step S26, as shown in FIG. 18, a free layer electrode 4 is deposited on the top of the free layer 3.

Figure 19:
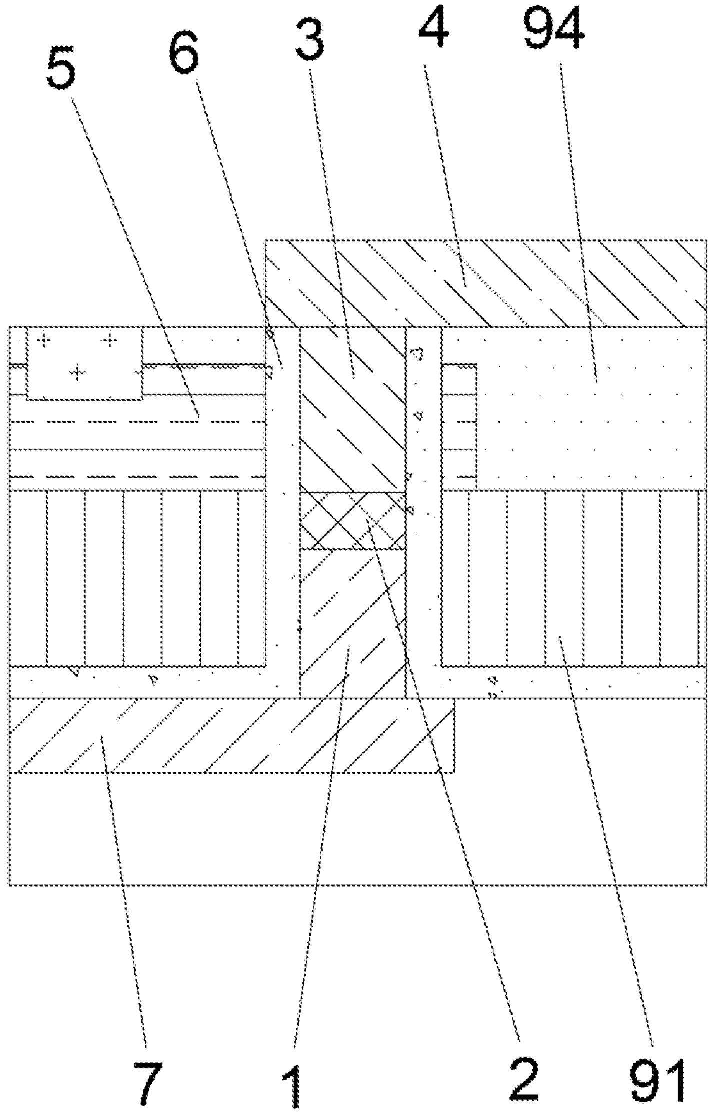
FIG. 19 is a schematic diagram showing etching an electrode to a required shape according to embodiments of the present disclosure.

In step S27, as shown in FIG. 19, the electrode material above the hole 921 in Step S20 is etched away to facilitate the preparation of a wire 8 for the VCMA electrode 5 as described later.

Figure 20:
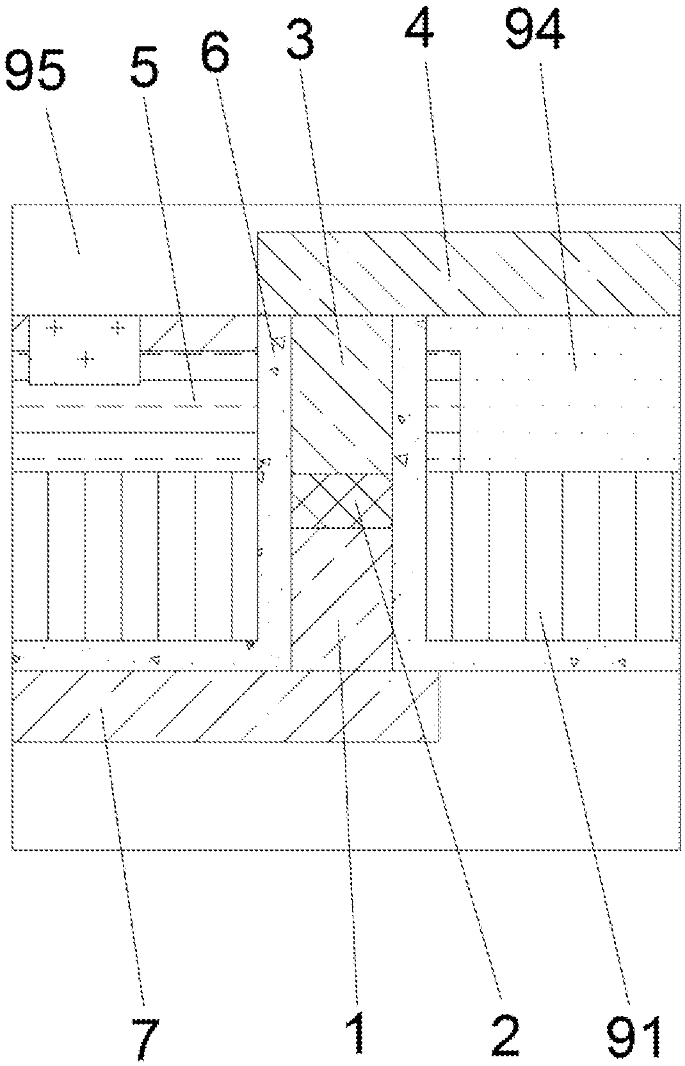
FIG. 20 is a schematic diagram of insulator filling and polishing according to embodiments of the present disclosure.

In step S28, as shown in FIG. 20, the periphery of the free layer electrode 4 is covered with an insulator isolation layer 95, and then the insulator isolation layer 95 is polished.

Figure 21:
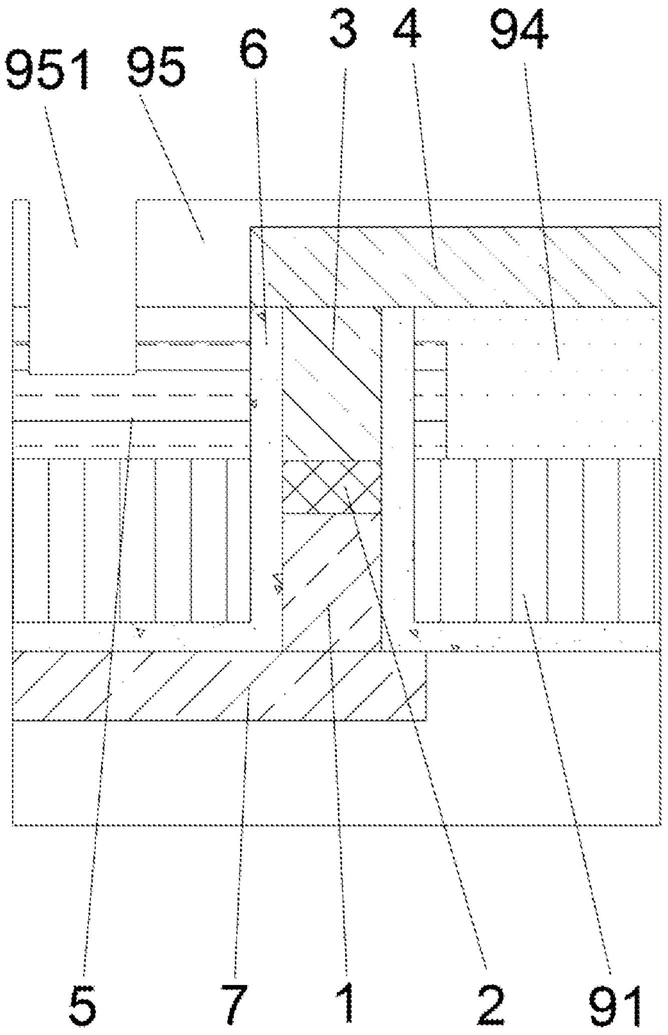
FIG. 21 is a schematic diagram of punching according to embodiments of the present disclosure.

In step S29, as shown in FIG. 21, a hole 951 is punched on the insulator isolation layer 95 above the VCMA electrode 5 until the hole contacts with the VCMA electrode 5.

Figure 22:
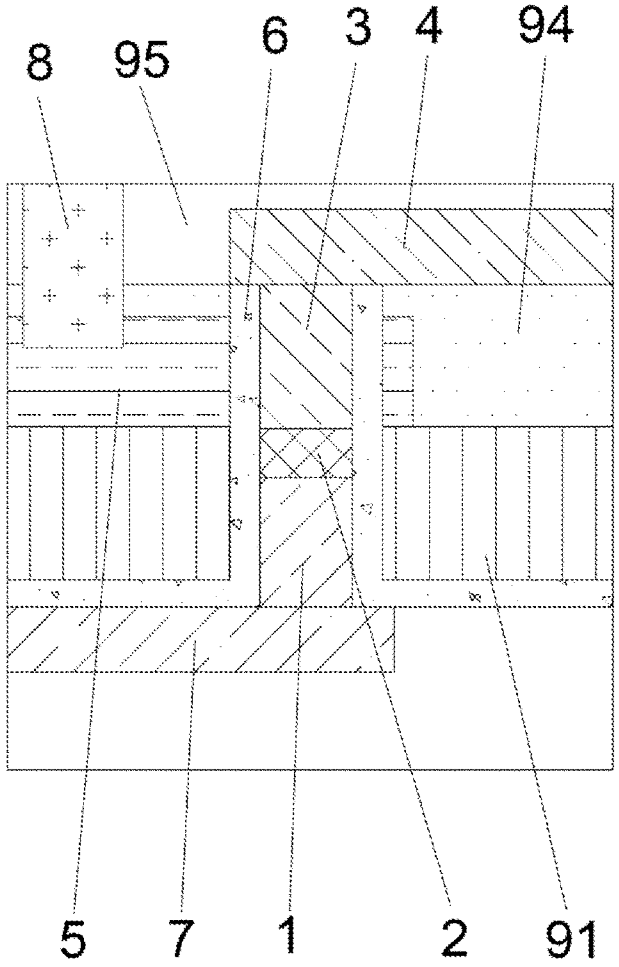
FIG. 22 is a schematic diagram of a final device obtained after forming a VCMA electrode according to embodiments of the present disclosure.

In step S30, as shown in FIG. 22, the wire 8 for connecting the VCMA electrode 5 to the outside is deposited in the hole 951 obtained in Step (S29).

As shown in FIG. 23A-FIG. 23D, a method of depositing a VCMA electrode capable of applying a voltage to the free layer (which may also be regarded as a single vertical columnar magnet) in Step S22 may also be carried out as follows.

Figure 23A:
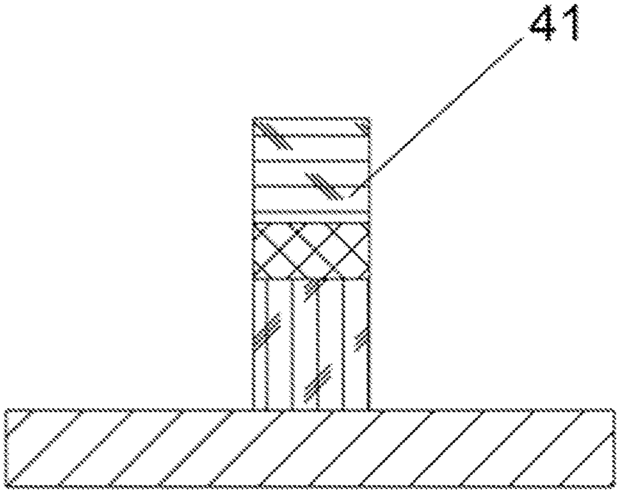
FIG. 23A-FIG. 23D are a flow chart of a preparation method for preparing a VCMA electrode capable of applying a voltage to a free layer according to embodiments of the present disclosure.

In step S221, as shown in FIG. 23A, a vertical columnar magnet 41 is prepared.

Figure 23B:
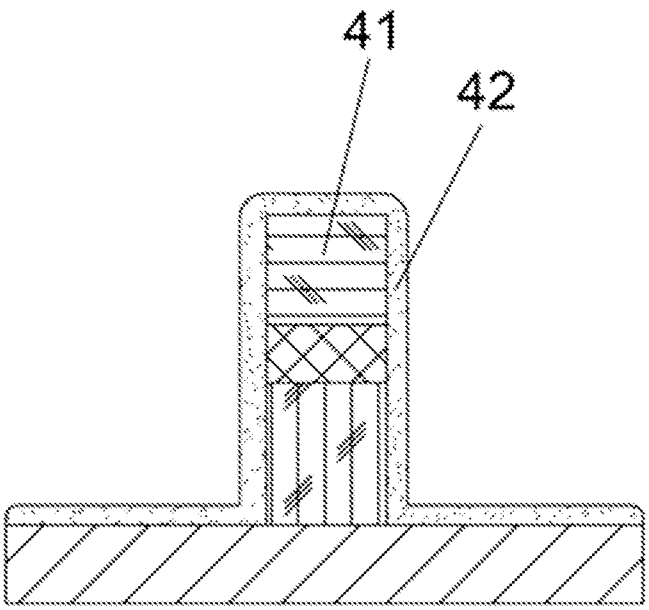

In step S222, as shown in FIG. 23B, an insulating layer thin film 42 is deposited on surfaces of the vertical columnar magnet 41.

Figure 23C:
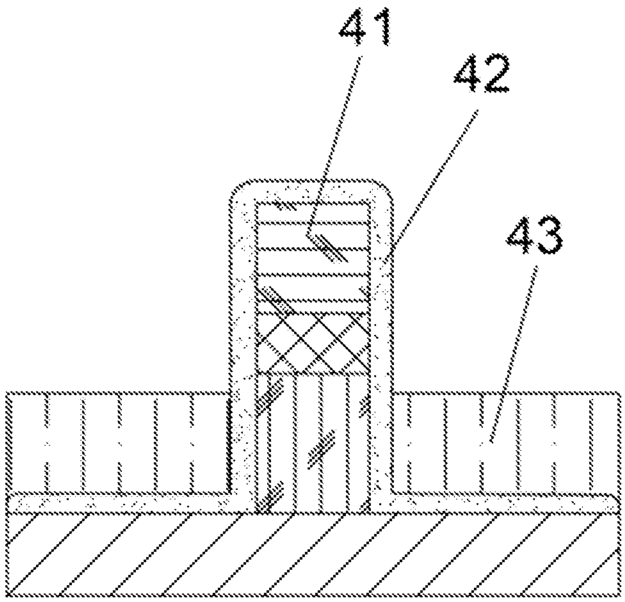

In step S223, as shown in FIG. 23C, a VCMA electrode 43 is directly deposited on the insulating layer thin film 42 to a target thickness.

Figure 23D:
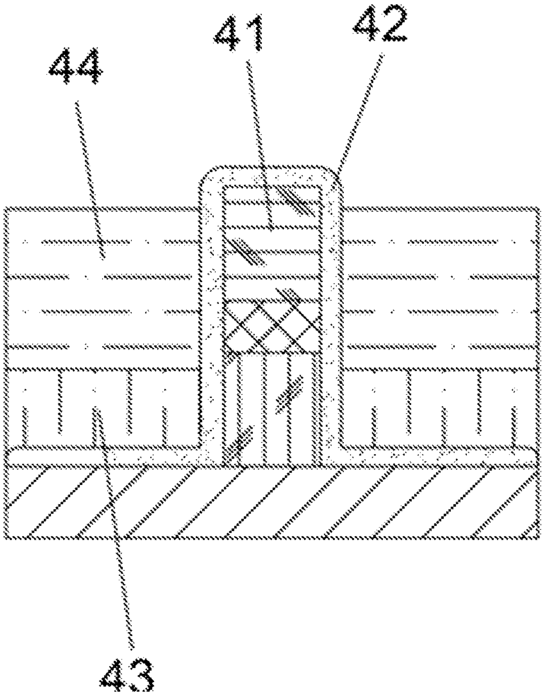

In step S224, as shown in FIG. 23D, the VCMA electrode 43 in Step S223 is covered with an insulator isolation layer 44 for protection.

Figure 24A:
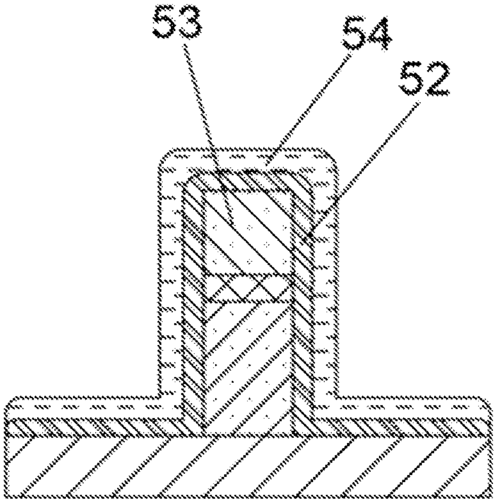
FIG. 24A-FIG. 24C are a flow chart of another preparation method for preparing a VCMA electrode capable of applying a voltage to a free layer according to embodiments of the present disclosure.
Figure 24B:
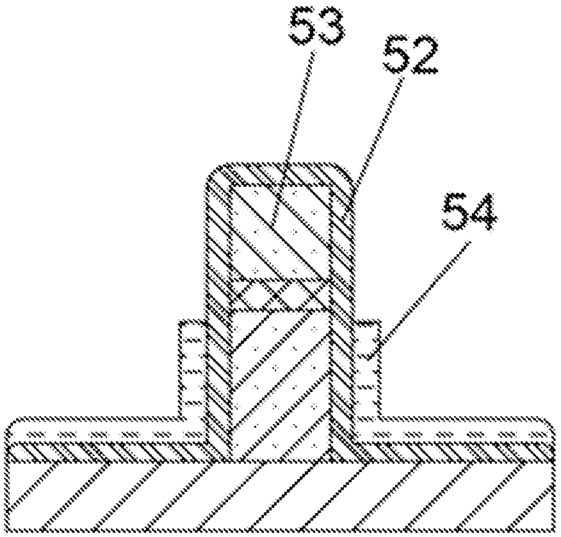
Figure 24C:
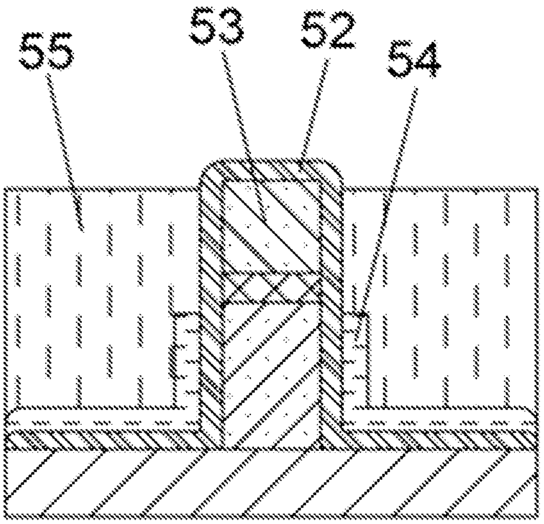

As shown in FIG. 24A-FIG. 24C, after Step S222, a method for forming an electrode capable of applying a voltage to the free layer (which may also be called vertical columnar magnet) may also be carried out as follows.

In step S2221, as shown in FIG. 24A, a layer of VCMA electrode 54 capable of applying a voltage to a vertical columnar magnet 53 is deposited on surfaces of an insulating layer thin film 52.

In step S2222, as shown in FIG. 24B, the VCMA electrode 54 on partial surfaces of the insulating layer thin film 52 not requiring voltage application is etched away.

In step S2223, as shown in FIG. 24C, the VCMA electrode 54 is covered with an insulator isolation layer 55 for protection.

The present disclosure is reasonable in structural design and simple in manufacturing process. A VCMA is generated from the side of the free layer, and does not have an effect to the tunnel insulating layer, so that the device provided by the present disclosure can improve the endurance of the tunnel insulating layer while reducing the magnetic anisotropy and helping STT to reduce information write-in energy consumption, thereby making it suitable for popularization and application.

The VCMA electrode may be connected to an outer surface of the insulating layer thin film by any one of connection methods, such as completely surrounding the outer surface of the insulating layer thin film, partially surrounding the outer surface of the insulating layer thin film, and contacting with a part of the outer surface of the insulating layer thin film.

Figure 25:
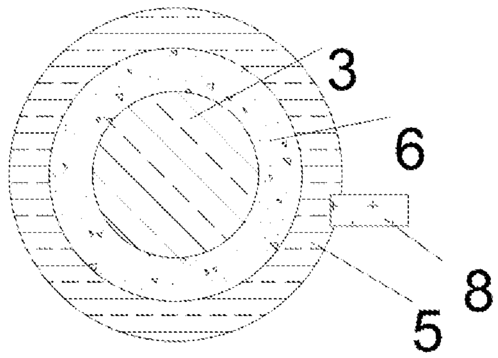
FIG. 25 is a schematic diagram of complete surrounding by a VCMA electrode according to embodiments of the present disclosure.

FIG. 25 is a schematic diagram of completely surrounding by a VCMA electrode according to embodiments of the present disclosure. The VCMA electrode 5 surrounds an outer ring of the insulating layer thin film 6.

When employing the connection method of partially surrounding the outer surface of the insulating layer thin film, the VCMA electrode may employ a partial surrounding method or two-part surrounding method. When employing a contact connection method of contacting with a part of the outer surface of the insulating layer thin film, the VCMA electrode may employ a single-point contact method or a multi-point contact method.

Figure 26:
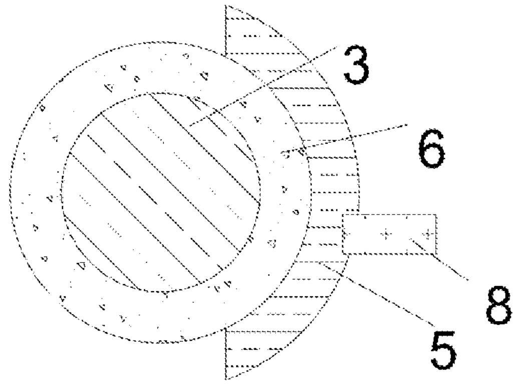
FIG. 26 is a schematic diagram of partial surrounding by a VCMA electrode according to embodiments of the present disclosure.
Figure 27:
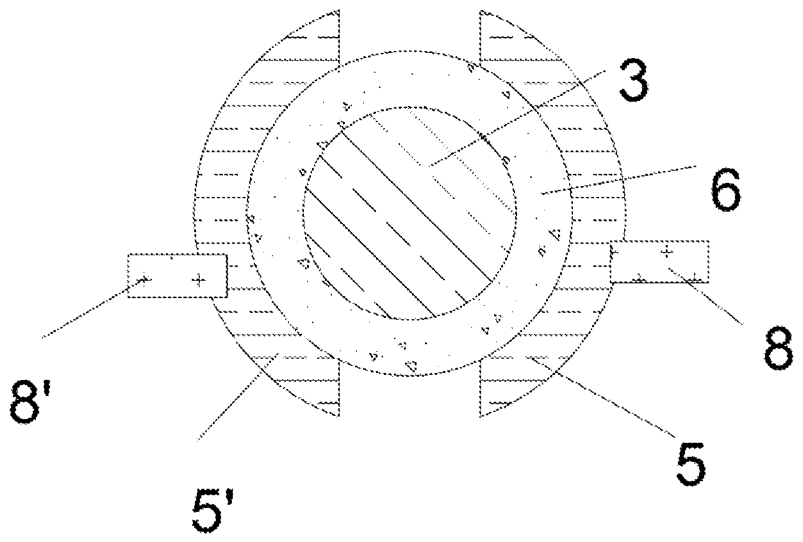
FIG. 27 is a schematic diagram of two-part surrounding by a VCMA electrode according to embodiments of the present disclosure.

FIG. 26 is a schematic diagram of partial surrounding by a VCMA electrode according to embodiments of the present disclosure. The VCMA electrode 5 partially surrounds the outer ring of the insulating layer thin film 6. FIG. 27 is a schematic diagram of two-part surrounding by a VCMA electrode according to embodiments of the present disclosure. The VCMA electrode 5 and the VCMA electrode 5' are respectively in contact with the insulating layer thin film 6 and surround the outer ring of the insulating film 6. Accordingly, one end of the wire 8 is connected to the VCMA electrode 5, and one end of the wire 8' is connected to the VCMA electrode 5'.

Figure 28:
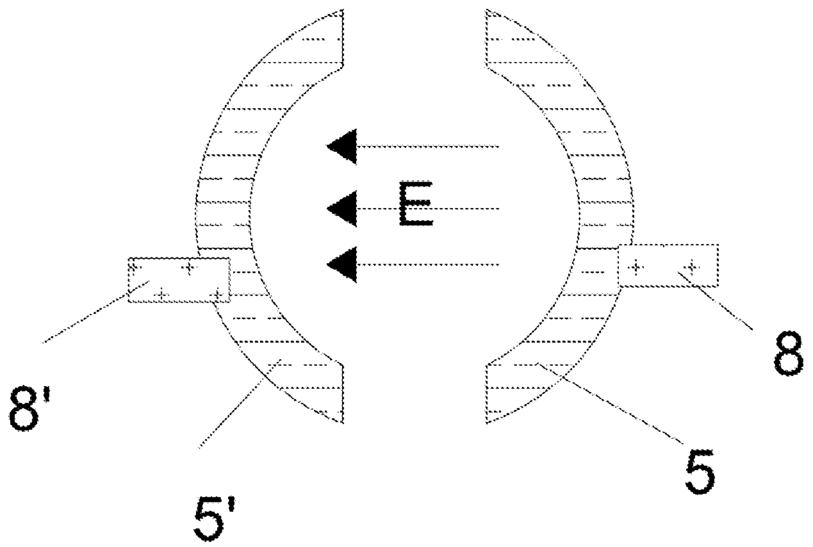
FIG. 28 is a principle diagram of two-part surrounding of a VCMA electrode according to embodiments of the present disclosure.

FIG. 28 is a schematic diagram of the principle of two-part surrounding by a VCMA electrode according to embodiments of the present disclosure. A voltage difference is formed between the wire 8 and the wire 8', so an electric field is formed between the VCMA electrode 5 and the VCMA electrode 5', and the electric field can also generate a VCMA effect on spinning electrons in the free layer 3.

Figure 29:
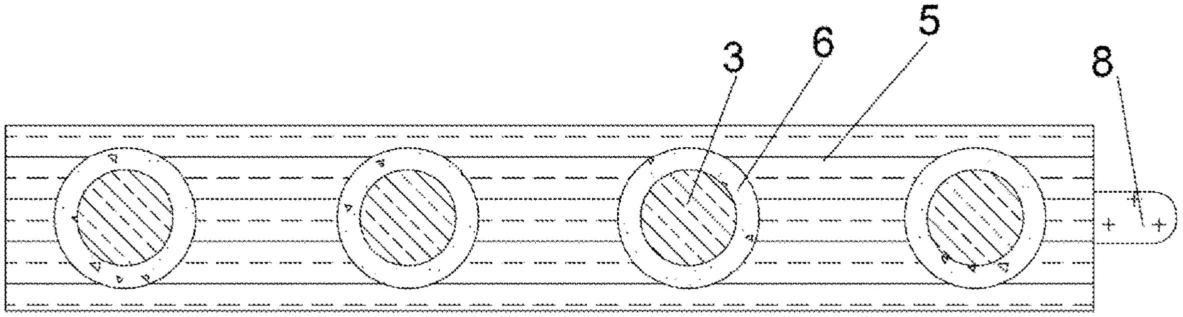
FIG. 29 is a top view of multiple devices corresponding to one VCMA electrode structure at a free layer of a MTJ according to embodiments of the present disclosure.
Figure 30:
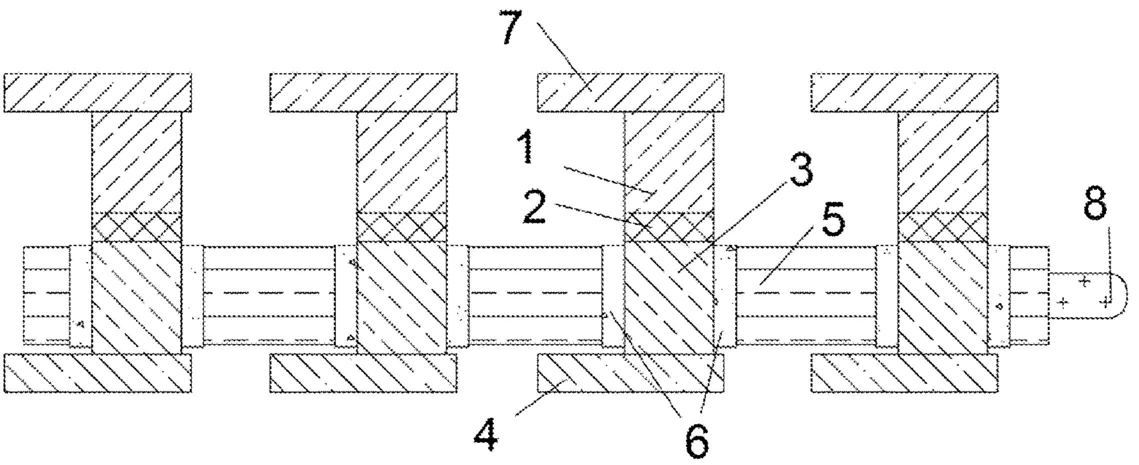
FIG. 30 is a front view of multiple devices corresponding to one VCMA electrode according to embodiments of the present disclosure.

One device corresponds to the VCMA electrode, or multiple devices corresponding to one VCMA electrode. Specifically, FIG. 29 is a top view of a structure of multiple devices corresponding to one VCMA electrode at a free layer of a MTJ according to embodiments of the present disclosure. FIG. 30 is a front view of multiple devices corresponding to one VCMA electrode according to embodiments of the present disclosure. As shown in FIG. 29 and FIG. 30, multiple devices share one VCMA electrode 5. The electrode 5 is only used for voltage application and does not consume energy. In addition, the joint use of multiple electrodes is simple in manufacturing process and capable of saving area.

Specific examples are used herein for illustration of the principles and implementation methods of the present disclosure. The description of the embodiments is merely used to help illustrate the method and its core principles of the present disclosure. In addition, a person of ordinary skill in the art can make various modifications in terms of specific embodiments and scope of application in accordance with the teachings of the present disclosure. In conclusion, the content of this specification should not be understood as the limitation to the present disclosure.

The embodiments of the present disclosure are described above with reference to the accompanying drawings, but the present disclosure is not limited to the above embodiments. The above embodiments are only schematic, not restrictive. Under the inspiration of the present disclosure, those of ordinary skill in the art can make many forms without departing from the spirit of the present disclosure and the claimed scope, which are all within the protection of the present disclosure.

What is claimed is:

1. A magnetic tunnel junction-based magnetic random access memory device, comprising two magnetic thin film structure bodies, and a non-magnetic thin film structure body sandwiched between the two magnetic thin film structure bodies; and side surfaces of one of the magnetic thin film structure bodies are provided with a Voltage Control Magnetic Anisotropy (VCMA) electrode capable of applying a voltage to the magnetic thin film structure body to control magnetic anisotropy of the magnetic thin film structure body; the VCMA electrode exhibits a non-centrosymmetric shape; wherein the VCMA electrode is prepared as follows:

after the two magnetic thin film structure bodies and the non-magnetic thin film structure body sandwiched between the two magnetic thin film structure bodies are etched to form a magnetic tunnel junction (MTJ) device, preparing an insulating layer thin film on an outer surface of the MTJ device and preparing a VCMA electrode on side surfaces of the magnetic thin film structure body requiring voltage application, comprise:

(1.1) depositing the insulating layer thin film on a surface of the MTJ device;

(1.2) depositing an insulator isolation layer on a part of the MTJ device not requiring voltage application;

(1.3) depositing a sacrificial layer which has different etching selectivity ratio from the insulator isolation layer in Step (1.2) and is able to be etched away, on a position of the MTJ device requiring voltage application, and etching the sacrificial layer to form a required pattern;

(1.4) depositing an insulator isolation layer on the sacrificial layer obtained in Step (1.3);

(1.5) depositing an electrode material on one end of the magnetic thin film structure body requiring voltage application, and etching the electrode material such that the electrode material has a non-overlapping part with the sacrificial layer etched in Step (1.3) in a top view angle, and then covering the non-overlapping part with an insulator isolation layer and polishing the insulator isolation layer flat;

(1.6) etching and punching a hole from a position above the sacrificial layer which is not overlapped with the electrode material in Step (1.5) until the hole contacts with the sacrificial layer, and etching away the sacrificial layer;

(1.7) depositing a VCMA electrode at a position where the sacrificial layer is etched away in Step (1.6); and (1.8) etching away redundant electrode material at the position of the hole in Step (1.6), depositing a wire for connecting the electrode material to the outside, and finally forming the VCMA electrode capable of applying a voltage to the magnetic thin film structure body.

2. The magnetic tunnel junction-based magnetic random access memory device according to claim 1, wherein the two magnetic thin film structure bodies are both ferromagnetic thin film structure bodies; an insulating layer thin film is arranged around side surfaces of a structure composed of the two ferromagnetic thin film structure bodies and the non-magnetic thin film structure body; an outer side surface of the insulating layer thin film is provided with a VCMA electrode capable of applying a voltage to one of the ferromagnetic thin film structure bodies to control the magnetic anisotropy.

3. The magnetic tunnel junction-based magnetic random access memory device according to claim 2, wherein the VCMA electrode is connected to the outer side surface of the insulating layer thin film by any one of connection modes comprising: completely surrounding the outer side surface of the insulating layer thin film, partially surrounding the outer side surface of the insulating layer thin film, and contacting with a part of the outer side surface of the insulating layer thin film.

4. The magnetic tunnel junction-based magnetic random access memory device according to claim 3, wherein the VCMA electrode employs a partial surrounding mode or two-part surrounding mode when employing the connection mode of partially surrounding the outer side surface of the insulating layer thin film; and the VCMA electrode employs a single-point contact mode or a multi-point contact mode when employing the contact connection mode of contacting with a part of the outer side surface of the insulating layer thin film.

5. The magnetic tunnel junction-based magnetic random access memory device according to claim 1, wherein the VCMA electrode is any one of a multilayer heterostructure composed of different materials, and a single structure composed of a same material.

6. The magnetic tunnel junction-based magnetic random access memory device according to claim 1, wherein one magnetic random access memory device corresponds to the VCMA electrode, or a plurality of magnetic random access memory devices correspond to one VCMA electrode.

7. A manufacturing method for a magnetic tunnel junction-based magnetic random access memory device, the method comprising the following steps:

preparing a bottom electrode;

preparing a magnetic thin film structure body on the prepared bottom electrode;

preparing a non-magnetic thin film structure body on the prepared magnetic thin film structure body;

preparing another magnetic thin film structure body on the non-magnetic thin film structure body;

etching the two magnetic thin film structure bodies and the non-magnetic thin film structure body to form a magnetic tunnel junction (MTJ) device;

preparing an insulating layer thin film on an outer surface of the MTJ device;

preparing a Voltage Control Magnetic Anisotropy (VCMA) electrode on side surfaces of the magnetic thin film structure body requiring voltage application, to control magnetic anisotropy of the magnetic thin film structure body; and preparing a wire for connecting the VCMA electrode to outside;

wherein the preparing an insulating layer thin film on an outer surface of the MTJ device and the preparing a VCMA electrode on the side surfaces of the magnetic thin film structure body requiring voltage application, comprise following steps:

(1.1) depositing the insulating layer thin film on a surface of the MTJ device;

(1.2) depositing an insulator isolation layer on a part of the MTJ device not requiring voltage application;

(1.3) depositing a sacrificial layer which has different etching selectivity ratio from the insulator isolation layer in Step (1.2) and is able to be etched away, on a position of the MTJ device requiring voltage application, and etching the sacrificial layer to form a required pattern;

(1.4) depositing an insulator isolation layer on the sacrificial layer obtained in Step (1.3);

(1.5) depositing an electrode material on one end of the magnetic thin film structure body requiring voltage application, and etching the electrode material such that the electrode material has a non-overlapping part with the sacrificial layer etched in Step (1.3) in a top view angle, and then covering the non-overlapping part with an insulator isolation layer and polishing the insulator isolation layer flat;

(1.6) etching and punching a hole from a position above the sacrificial layer which is not overlapped with the electrode material in Step (1.5) until the hole contacts with the sacrificial layer, and etching away the sacrificial layer;

(1.7) depositing a VCMA electrode at a position where the sacrificial layer is etched away in Step (1.6); and (1.8) etching away redundant electrode material at the position of the hole in Step (1.6), depositing a wire for connecting the electrode material to the outside, and finally forming the VCMA electrode capable of applying a voltage to the magnetic thin film structure body.

* * * * *